(12) United States Patent
Stratmann

(10) Patent No.: US 7,782,175 B2
(45) Date of Patent: Aug. 24, 2010

(54) SWITCH ACTING IN A CONTACTLESS FASHION

(75) Inventor: Christoph Stratmann, Essen (DE)

(73) Assignee: K.A. Schmersal Holding KG (DE)

( * ) Notice: Subject to any disclaimer, the term of this patent is extended or adjusted under 35 U.S.C. 154(b) by 959 days.

(21) Appl. No.: 11/370,482

(22) Filed: Mar. 7, 2006

(65) Prior Publication Data

US 2006/0220846 A1    Oct. 5, 2006

(30) Foreign Application Priority Data

Mar. 18, 2005    (DE)    .................. 10 2005 013 102

(51) Int. Cl.
*G06F 7/04* (2006.01)
(52) U.S. Cl. .............. 340/5.61; 340/686.6; 340/539.23; 324/207.15; 324/232; 307/652
(58) Field of Classification Search .................. 49/356; 73/1.23, 1.44; 340/539.23, 545.2, 545.3, 340/545.4, 572.4, 5.61, 5.64, 5.65, 5.66, 340/680, 686.1, 686.6; 324/207.11, 207.15, 324/207.19, 207.22, 232, 234, 236, 326, 324/327, 662; 307/652
See application file for complete search history.

(56) References Cited

U.S. PATENT DOCUMENTS

| | | | | |
|---|---|---|---|---|
| 5,467,082 | A * | 11/1995 | Sanderson | 340/5.61 |
| 5,986,549 | A * | 11/1999 | Teodorescu | 340/561 |
| 6,409,083 | B1 * | 6/2002 | Link | 235/449 |
| 6,577,238 | B1 * | 6/2003 | Whitesmith et al. | 340/572.1 |
| 6,816,106 | B1 * | 11/2004 | Butler | 342/45 |

FOREIGN PATENT DOCUMENTS

| | | |
|---|---|---|
| DE | 297 10 694 U1 | 10/1997 |
| DE | 10043237 | 11/2001 |

(Continued)

OTHER PUBLICATIONS

Jeffery Hightower et al., Design and Calibration of the spotON Ad-Hoc Location Sensing System, Aug. 2001, downloaded from: http://portolano.cs.washington.edu/projects/spoton/.*

*Primary Examiner*—Daniel Wu
*Assistant Examiner*—Nay Tun
(74) *Attorney, Agent, or Firm*—Townsend and Townsend and Crew LLP

(57) ABSTRACT

The invention relates to a switch acting in contactless fashion for the purpose of detecting the position of a first part with respect to a second part, having a transceiver for attachment to one of the parts, which transceiver is supplied with power by an electrical supply source and comprises a coil, which is connected to a transmission/reception circuit, for the purpose of transmitting an interrogation signal and for the purpose of receiving a response signal, which can be transmitted in response to the interrogation signal by a transponder which can be arranged on the other part, wherein in addition to a first path for processing the response signal to an evaluation circuit, a second path is provided which has a proximity circuit, which is connected on the input side to a connection of the coil and on the output side to the evaluation circuit for the amplitude of the voltage tapped off by the coil for the purpose of determining the distance between the parts.

11 Claims, 2 Drawing Sheets

FOREIGN PATENT DOCUMENTS

| | | |
|---|---|---|
| DE | 10043237 C1 * | 11/2001 |
| DE | 10222186 | 10/2003 |
| DE | 10222186 C1 * | 10/2003 |
| DE | 10337660 | 6/2004 |
| EP | 06005134 | 7/2006 |

* cited by examiner

SWITCH ACTING IN A CONTACTLESS FASHION

BACKGROUND OF THE INVENTION

The invention relates to a switch acting in contactless fashion.

DE 103 37 660 A1 has disclosed a switch acting in contactless fashion for a rolling door controller, which produces switching signals corresponding to the position of a movable rolling door at a controller for the purpose of adapting the moving speed of the rolling door depending on the respective position, in order that the rolling door is accelerated optimally, moved quickly and moved slowly into the respective end position. For this purpose, passive RFID transponders are arranged along the side edge of the rolling door and act as actuators for a sensor, which is fixed in position on a rolling door frame, of the switch. In this case, the sensor transmits an interrogation signal via a coil of a transceiver supplied with power and recognizes a position of the rolling door as soon as an RFID transponder sends a response signal back as a result of a sufficient proximity to the coil. The accuracy of the determination of the position which can be achieved with the known switch is thus dependent on the shape of the radiation lobe of the electromagnetic field emitted by the transceiver and is thus low in practice. The known switch is therefore not suitable for accurate determination of the position of the moving part in order, for example, to establish whether a protective door is sufficiently closed in order to be held closed securely by a tumbler acting in contactless fashion.

In order to precisely monitor the position of a moving part with respect to a fixed part, inductive proximity switches are known which provide a voltage signal dependent on the distance between the two parts, cf. DE 44 27 283 C1, for example. However, these apparatuses are independent and require a dedicated sensor and a dedicated evaluation circuit.

BRIEF SUMMARY OF THE INVENTION

The invention is therefore based on the object of providing a switch acting in contactless fashion, which makes possible, given a simple design, precise distance determination, in addition to unique identification of a part, and which in the process can be produced in a cost-effective manner.

This object is achieved corresponding to the features in claim 1.

This provides a switch acting in contactless fashion for the purpose of detecting the position of a first part with respect to a second part, having a transceiver for attachment to one of the parts, which transceiver is supplied with power by an electrical supply source and comprises a coil, which is connected to a transmission/reception circuit, for the purpose of transmitting an interrogation signal and for the purpose of receiving a response signal, which can be transmitted in response to the interrogation signal by a transponder which can be arranged on the other part, a proximity circuit being connected on the input side to a connection of the coil and on the output side to an evaluation circuit for the amplitude of the voltage tapped off by the coil for the purpose of determining the distance between the parts. As a result, identification of a part by means of a transponder and precise induction-based distance determination between the parts are made possible using only one sensor and a common evaluation circuit in a switch which has a simple design and can be produced in a cost-effective manner. Owing to the use of two different effects, redundancy is also achieved, which is expedient for safety applications.

In this case, the amplitude is expediently the maximum amplitude of the AC voltage signal tapped off at the coil or the amplitude of the AC voltage signal tapped off at the coil and rectified. These amplitudes can be produced using simple components for further processing purposes or can be calculated from the AC voltage signal in a microcontroller or the like.

The evaluation circuit expediently comprises a comparator for the purpose of comparing the amplitude with a threshold value. This makes it possible to establish, without a great deal of complexity, whether a limit distance between the parts is undershot or exceeded.

An enable signal can expediently only be produced in the case of unique identification of the transponder when the amplitude exceeds a threshold value. As a result, the limit distance between the parts can be set when the switch is mounted by simply setting the threshold value, and if this limit distance is exceeded, the enable signal is produced.

The proximity circuit expediently comprises an analogue-to-digital converter. As a result, the signal corresponding to the distance can be evaluated digitally, for example in a signal processor, microcontroller or the like.

The transponder is expediently a rod transponder. As a result, a reception characteristic which is straighter than in the case of disc transponders and an increased interference-free packing density are achieved.

The evaluation circuit is expediently also coupled to the transmission/reception circuit for the purpose of evaluating the response signal. As a result, the transponder information item and the proximity information item can be evaluated using only one, in particular microcontroller-based, evaluation circuit.

The transmission/reception circuit expediently comprises an excitation circuit, which can be switched by the evaluation circuit, for the coil. As a result, excitation of the coil can be temporally controlled depending on the requirements and can be switched off if required, for example in order to save on energy when using a plurality of switches in a battery-operated device.

The frequency filter and/or a DC voltage circuit can be implemented by programming a microcontroller, which is expediently part of the evaluation circuit. As a result, components can be dispensed with and replaced by a signal-processing component, in particular a program, in the microcontroller, as a result of which the design of the switch is further simplified.

Further refinements of the invention are described in the description below and the dependent claims.

BRIEF DESCRIPTION OF THE DRAWINGS

The invention will be explained in more detail below with reference to exemplary embodiments illustrated in the attached drawings.

DETAILED DESCRIPTION OF THE INVENTION

Figure 1:
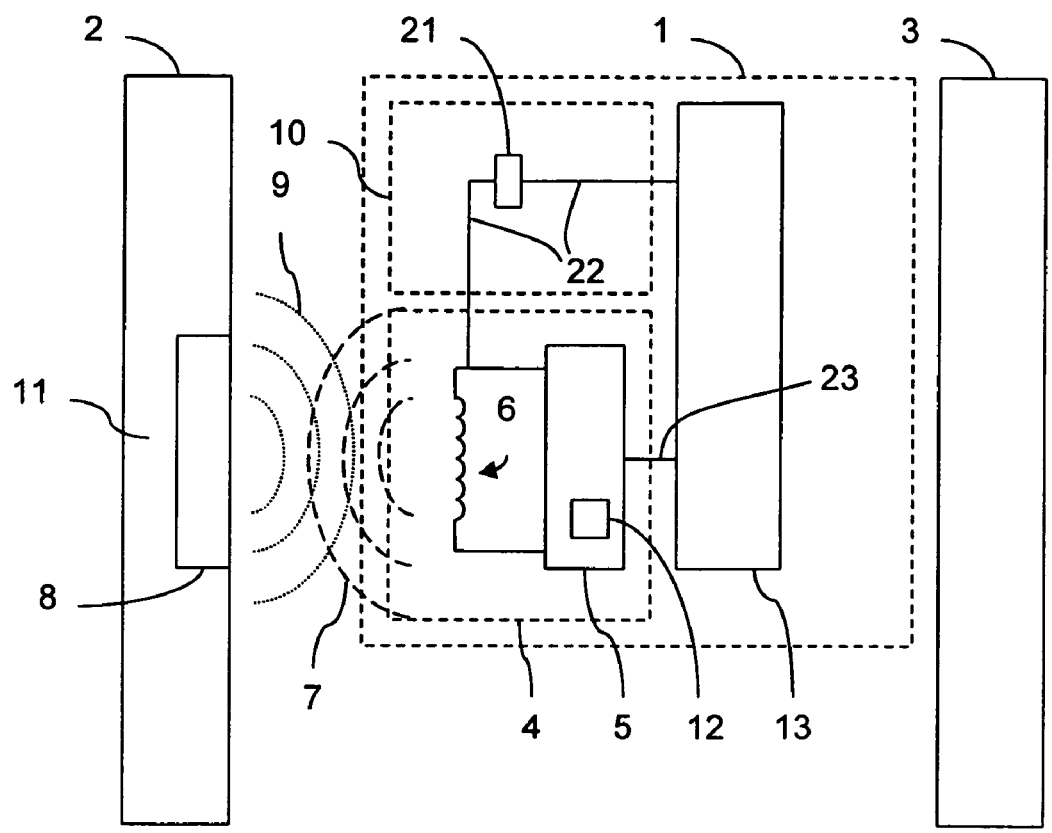
FIG. 1 shows a schematic of a switch on one part and a transponder on another part of a position-monitored apparatus.

The switch 1 acting in contactless fashion and illustrated in FIG. 1 for the purpose of detecting the position of a first part 2, for example an extendable support of a mobile crane or a safety door, with respect to a second part 3, for example a frame part of the mobile crane or a door frame, comprises a transceiver 4, which is supplied with power, for example, via a bus or a battery, on the part 3 having a coil 6, which is connected to a transmission/reception circuit 5, for the purpose of transmitting an interrogation signal in response to an AC voltage exciting the coil 6 and for the purpose of receiving a response signal 9, which can be transmitted in response to the interrogation signal 7 by an expediently passive transponder 8 which is fitted to the part 2.

In addition, an induction-based proximity circuit 10 is provided for the purpose of determining the distance between the parts 2, 3 and functions as follows. The AC voltage exciting the coil 6 leads to electromagnetic waves being transmitted by the coil 6, which form the interrogation signal 7 and are only partially absorbed by the transponder 8 and are used for producing the response signal 9. The proportion of the interrogation signal which is not absorbed by the transponder 8 passes into the material 11 of the part 2 which surrounds the transponder 8 and induces eddy currents there, which in turn lead to damping of the field of the coil 6. The degree of damping is dependent on the properties of the material 11, in particular its conductivity for electrical current, and is a function of the distance between the coil 6 and the material 11. If there is a short distance, severe damping takes place, while little damping takes place if the distance is long.

In order to determine the distance between the coil 6 and the material 11, the proximity circuit 10 taps off the AC voltage applied to the coil 6 and passes it here to a frequency filter 21, for example a bandpass filter. The frequency filter 21 in this case only allows AC voltages to pass which have a frequency in the region of the frequency exciting the coil 6, i.e. only the components damping the excitation of the coil 6. Interference signals and the other frequency components produced by modulation of the response signal 9 are thus blanked out for the distance determination. If appropriate, a DC/DC converter is connected downstream of the frequency filter 21 or integrated in it. The DC/DC converter provides a DC voltage at its output which has an amplitude which represents the maximum amplitude of the AC voltage, the amplitude of the rectified AC voltage or an amplitude which in another way represents the maximum amplitude of the AC voltage. The amplitude which is a measure of the distance between the parts 2, 3 is expediently fed to an in particular digital evaluation circuit 13 in the form of a microcontroller or the like, with the interposition of an analogue-to-digital converter, said evaluation circuit 13 in this case also being coupled to the transmission/reception circuit 5 for the common evaluation of the response signal 9, and being capable, if appropriate, of switching an excitation circuit 12 contained in said transmission/reception circuit 5 so as to excite the coil 6. The digital evaluation circuit 13 may comprise a signal-processing program code which takes on the function of the frequency filter 21 and, if appropriate, the DC/DC converter.

The switch 1 has a path 22 for the purpose of evaluating the distance between the coil 6 and the material 11 of the part 2. Part of the path 22 is the proximity circuit 10. The coil 6 is connected to the evaluation circuit 13 via the path 22. A second path 23 is provided which passes from the transmission/reception circuit 5 to the evaluation circuit 13. The second path 23 is used to evaluate the response signal 9 transmitted by the transponder 8. The response signal 9 can contain the identity of the transponder 8, i.e. the ID of the transponder 8. The two paths 22, 23 function independently of one another. The distance between the coil 6 and the material 11 of the part 2 can be determined precisely and permanently. The interrogation signal 7 is a carrier signal having a constant frequency, whose amplitude is affected by the material 11 of the part 2 or the transponder 8 as this material is moved closer, as a result of which the amplitude of the response signal 7 becomes smaller. The change in amplitude is used in both paths 22, 23. The evaluation of the distance takes place permanently. The communication between the transmission/reception circuit 5 and the transponder 8 takes place using alternate dialogue. The ID of the transponder 8 can be identified at the same time as the evaluation of the distance. It is also possible for data to be written to a memory of the transponder 8 by means of modulation of the interrogation signal 7. In particular, provision may be made for counter readings to be stored in a memory of the transponder 8. In particular, a counter reading may be provided which specifies how often the transponder 8 has until now come into the interrogation range of the switch 1, i.e. has been moved closer to the switch 1. A counter reading can be interrogated in a targeted manner by the evaluation circuit 13 and the transmission/reception circuit 5 and altered in the memory of the transponder 8, if required.

The measured distance and/or an information item relating to the transponder 8 can be provided, in particular digitally, at an output or at separate outputs of the switch 1. In addition or instead, a switching signal may be provided at an output of the switch 1 if a specific transponder 8 is recognized by the switch 1 and the distance corresponds to predetermined inputs. For this purpose, the switch 1 may contain information items relating to one or more associated transponders 8 and a distance or a distance range or a limit distance, which needs to be undershot or exceeded, or other conditions relating to one or more transponders and the distance.

Figure 2:
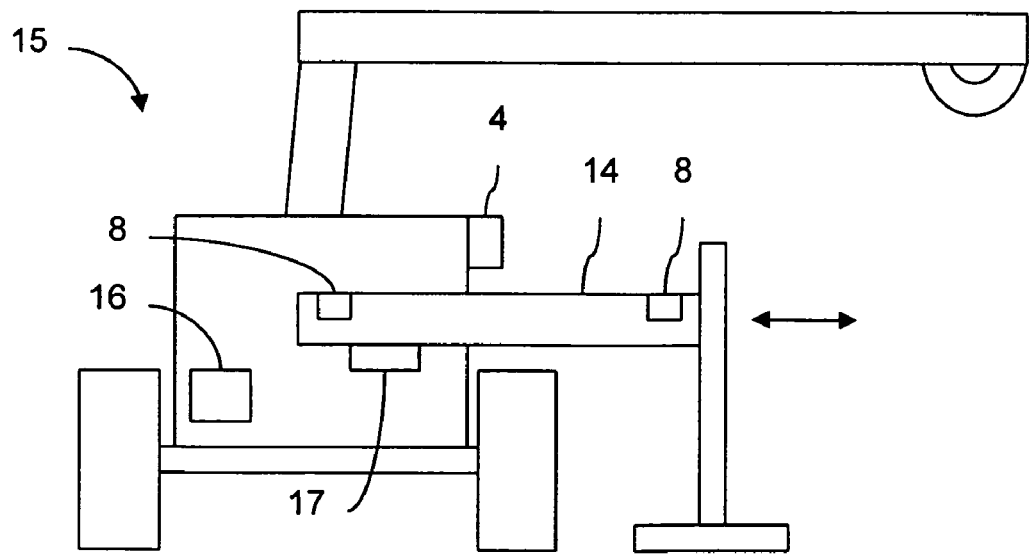
FIG. 2 illustrates the operation of the switch on a mobile crane.

The switch 1 can be used, for example, for the purpose of determining the position of an extendable support 14 of a mobile crane 15, cf. FIG. 2.

In the process, a crane controller 16 instigates the extension of the support 14 by means of a drive 17. Transponders 8, in this case in the form of, in particular, RFID rod transponders which are arranged flush are provided at points of interest in the support 14 and are moved past the transceiver 4, which is fixed in position on the frame of the mobile crane 15, one after the other when the support 14 is extended.

Figure 3:
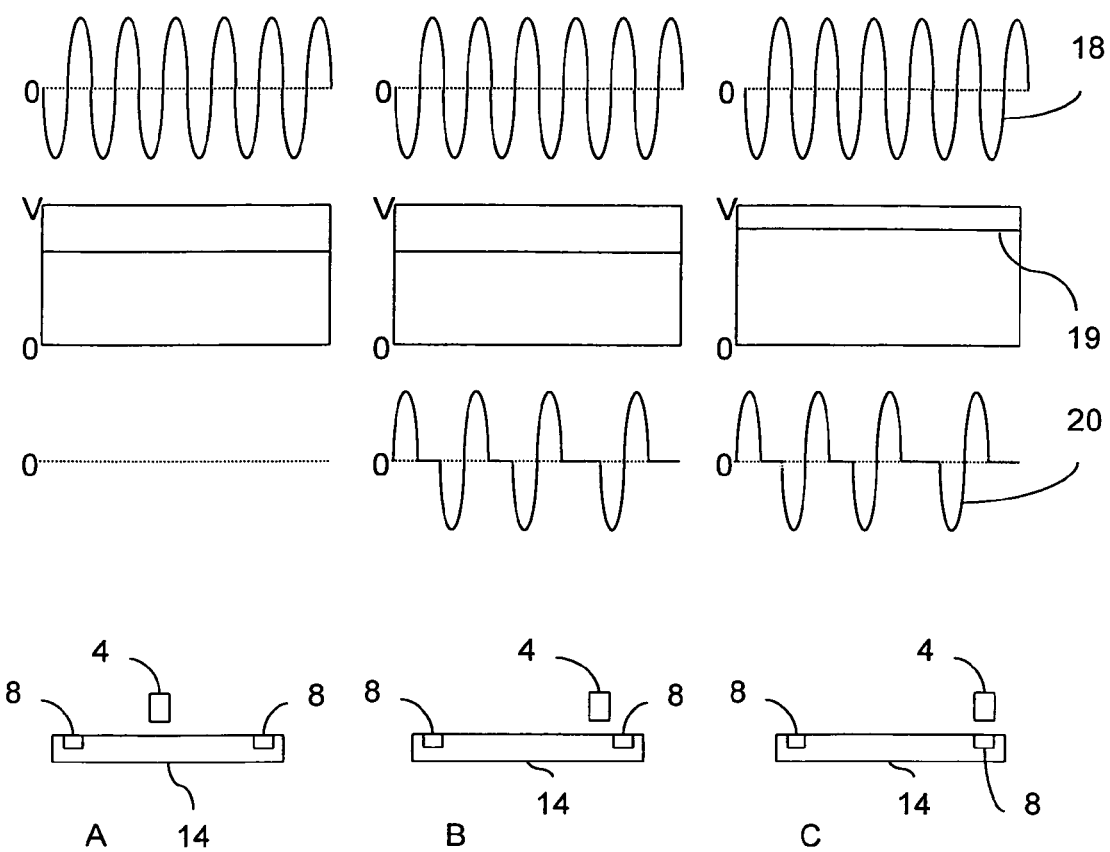
FIG. 3 shows the output signals from the switch in FIG. 2.

The signal profile which is illustrated in FIG. 3 in three columns for in each case one position A, B, C of the support results during this passing movement.

An interrogation signal 18 in the form of an electromagnetic alternating field having a frequency, which in this case is constant at, for example 125 kHz and, if appropriate is varying, it being possible for said interrogation signal 18 to be marked and to contain amplitude- or frequency-modulated information bits for the transponder 8, is continuously or, if appropriate, periodically transmitted by the coil 6 of the transceiver 4 in response to excitation by the transmission/reception circuit 5.

In position A, there is no transponder 8 in the vicinity of the transceiver 4. The interrogation signal 18 therefore interacts exclusively with the material 11 of the support 14 and is damped by this material 11. The amplitude of the damped AC voltage applied to the coil 6 is illustrated as a signal 19 in the left-hand column in FIG. 3.

In position B, a transponder 8 is in the region of the interrogation signal 18 transmitted by the transceiver 4. Part of the interrogation signal 18 is received by a coil in the transponder 8. The energy of the received part of the interrogation signal 18 expediently provides the operating energy for the transponder 8, which, however, may also be supplied with power independently, for example via a battery. The transponder 8 transmits a response signal 20 in response to the interrogation signal 18. The response signal 20 may in the simplest case have a specific frequency or may modulate information bits, for example unique transponder identification, serially onto the interrogation signal 18. The response signal 20 may depend, in addition, on the received information bits, for example a key may be stored in the transponder 8, by means of which received information bits are encoded and are then sent back to the transceiver 5. The response signal 20 transmitted by the transponder 8 in position B is received by the coil 6 and analysed in the evaluation circuit 13. For this purpose, the frequency of the response signal 20 or a marking can be recognized, and it is thus possible to establish whether a specific transponder 8 is available. The signal 19 remains essentially unchanged in position B.

In position C, the transponder 8, as is already the case in position B, is in the region of the interrogation signal 18 transmitted by the transceiver 4 and can be uniquely recognized by evaluating the response signal 20. In addition, the region below the transponder 8 is directly opposite the transceiver 4 in position C. This region is cut out for the purpose of accommodating the transponder 8, with the result that the material 11 is further removed from the coil 6 of the transceiver 4. Owing to the increased distance between the material 11 and the coil 6, the signal 19 is stronger.

The evaluation circuit 13 of the switch 1 is expediently designed such that, in the case of the extendable support 14, an enable signal for the operation of the mobile crane 15 is only produced when the support 14 is completely extended in position C, i.e. when, on the one hand, the transponder 8 associated with position C is identified and, on the other hand, a threshold value for the amplitude has been exceeded or the amplitude of the value of position B changes to the value of position C or the amplitude is within a predeterminable voltage range.

The information item representing the measured distance, in this case the signal 19, and the information item relating to a transponder, in this case the response signal 20, can also be linked to one another in another manner in order to produce the enable signal. For example, the changes in the signal 19 can be counted, in which case in particular regularly spaced-apart notches are expediently provided in the surface, which faces the coil 6, of the part 2, or the absolute value of the voltage value of the signal 19 can be taken into account. In addition, the switch can transmit data representing the signal 19 and the response signal 20 to a controller via a bus, said controller taking on the function of further evaluation and producing control signals on the basis of this, the switch 1 in this case not needing to provide a switching signal.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A switch acting in contactless fashion for determining a distance between a first part and a second part, the switch comprising:
   a transceiver for attachment to one of the parts, the transceiver comprising a coil and being configured to receive power from an electrical supply source, wherein the amplitude of signals transmitted at the coil are affected by material located at the other of the parts;
   a transmission/reception circuit connected to the transceiver, the transmission/reception circuit being configured to:
      transmit an interrogation signal at the coil, with the amplitude of the interrogation signal representing the distance between the first and second parts, and
      receive a response signal, the response signal comprising a signal transmitted in response to the interrogation signal by a transponder, the transponder having an identifier and being attached to the other of the parts;
   a first path comprising a proximity circuit connected for receiving the interrogation signal from the coil and to determine the distance between the parts based at least partly on an evaluation of the amplitude of the interrogation signal received from the coil; and
   a second path comprising:
      an evaluation circuit connected to the transmission/reception circuit to at least partly control whether the coil transmits the interrogation signal or receives the response signal,
      wherein the second path is configured to identify the transponder based at least partly on the response signal, and
   wherein the first and second paths are configured such that the transponder is identified at substantially the same time as the distance between the parts is determined.

2. A switch according to claim 1, wherein the proximity circuit comprises a frequency filter, whose input is connected to the coil.

3. A switch according to claim 1, wherein the amplitude of the interrogation signal received from the coil is the maximum amplitude of an AC voltage signal tapped off at the coil or an amplitude of the AC voltage signal tapped off at the coil and rectified.

4. A switch according to claim 1, wherein the proximity circuit is connected to the evaluation circuit and wherein the evaluation circuit comprises a comparator for the purpose of comparing the amplitude with a threshold value.

5. A switch according to claim 1, wherein an enable signal can only be produced in the case of unique identification of the transponder when the amplitude exceeds a threshold value.

6. A switch according to claim 1, wherein the proximity circuit comprises an analog-to-digital converter.

7. A switch according to claim 1, wherein the transponder is a rod transponder.

8. A switch according to claim 1, wherein the evaluation circuit is coupled to the transmission/reception circuit and is configured to evaluate the response signal.

9. A switch according to claim 8, wherein the transmission/reception circuit comprises an excitation circuit, which can be switched by the evaluation circuit, for the coil.

10. A switch according to claim 1, wherein the evaluation circuit comprises a microcontroller, and a frequency filter and/or a DC voltage circuit is implemented by programming of the microcontroller.

11. The switch according to claim 1, wherein the proximity circuit receives the interrogation signal from the coil by tapping off an AC voltage at the coil.

* * * * *